United States Patent
Cutler et al.

(10) Patent No.: US 12,394,618 B2
(45) Date of Patent: Aug. 19, 2025

(54) METHOD OF ADJUSTING WAFER SHAPE USING MULTI-DIRECTIONAL ACTUATION FILMS

(71) Applicant: Tokyo Electron Limited, Tokyo (JP)

(72) Inventors: Charlotte Cutler, Hopkinton, NY (US); Michael Murphy, Latham, NY (US); Anthony R. Schepis, Averill Park, NY (US)

(73) Assignee: Tokyo Electron Limited, Tokyo (JP)

( * ) Notice: Subject to any disclaimer, the term of this patent is extended or adjusted under 35 U.S.C. 154(b) by 635 days.

(21) Appl. No.: 17/684,473

(22) Filed: Mar. 2, 2022

(65) Prior Publication Data

US 2023/0008350 A1    Jan. 12, 2023

Related U.S. Application Data

(60) Provisional application No. 63/219,414, filed on Jul. 8, 2021.

(51) Int. Cl.
*H01L 21/31* (2006.01)
*H01L 21/02* (2006.01)
*H01L 21/469* (2006.01)

(52) U.S. Cl.
CPC .............................. *H01L 21/02035* (2013.01)

(58) Field of Classification Search
CPC ............ H01L 21/302; H01L 21/31058; H01L 21/02002–02035; H01L 21/67288; H01L 21/02299–02315; H01L 21/02318–02362; H01L 22/12; H01L 21/486; H01L 21/563; H01L 21/78; H01L 21/4857; H01L 21/568; H01L 21/6835; H01L 21/60; H01L 21/4832;

(Continued)

(56) References Cited

U.S. PATENT DOCUMENTS 9,397,051 B2   7/2016  Uzoh
9,824,894 B2  11/2017  deVilliers
9,853,000 B2  12/2017  Uzoh (Continued)

FOREIGN PATENT DOCUMENTS

KR   10-2019-0118191 A   10/2019

OTHER PUBLICATIONS

International Search Report and Written Opinion issued on Oct. 13, 2022 in PCT/US2022/033748 filed on Jun. 16, 2022, 9 pages.

(Continued)

*Primary Examiner* — Niki H Nguyen
(74) *Attorney, Agent, or Firm* — Oblon, McClelland, Maier & Neustadt, L.L.P.

(57) ABSTRACT

Techniques herein include methods for coating a single layer actuator film or multi-layer actuator film on the backside of a wafer. The actuator film includes one or more chemical actuators. Chemical actuators are various molecules, crystals, chemical compounds and other chemical compositions that are capable of imposing directional stress in response to application of an external stimulus on the chemical actuator. The external stimulus can include a particular wavelength of light or polarization of light, or heat (or directed infrared radiation) or load, which can include load-responsive actuation or pressure-responsive actuation.

20 Claims, 15 Drawing Sheets

(58) Field of Classification Search
CPC .............. H01L 21/565; H01L 21/76254; H01L 21/76877; H01L 21/76898
See application file for complete search history.

(56) References Cited

U.S. PATENT DOCUMENTS

| | | | |
|---|---|---|---|
| 10,157,747 | B2 | 12/2018 | deVilliers |
| 10,431,468 | B2 | 10/2019 | deVilliers et al. |
| 10,453,692 | B2 | 10/2019 | deVilliers et al. |
| 10,475,657 | B2 | 11/2019 | deVilliers |
| 10,622,233 | B2 | 4/2020 | Hooge et al. |
| 10,811,265 | B2 | 10/2020 | deVilliers |
| 2007/0224522 | A1 | 9/2007 | Lee et al. |
| 2015/0294917 | A1* | 10/2015 | deVilliers .............. H01L 21/302 438/7 |
| 2021/0335688 | A1* | 10/2021 | Park .................. H01L 21/76898 |

OTHER PUBLICATIONS

Mingsen Chen, et al., "Entangled Azobenzene-Containing Polymers with Photoinduced Reversible Solid-to-Liquid Transitions for Healable and Reprocessable Photoactuators", Advanced Functional Materials, vol. 30, Issue 4, Jan. 23, 2020, 9 pages.

Chengwei Wang, et al., "A Solution-Processed High-Temperature, Flexible, Thin-Film Actuator", Advanced Materials, vol. 28, Issue 39, Aug. 22, 2016, pp. 8618-8624 (Abstract only).

Bing Han, et al., "Carbon-Based Photothermal Actuators", Advanced Functional Materials, vol. 28, Issue 40, Aug. 12, 2018, 23 pages.

Tongyu Wang, et al., "Maximizing the performance of photothermal actuators by combining smart materials with supplementary advantages", Science Advances, vol. 3, Issue 4, Apr. 21, 2017, 9 pages.

Taylor H. Ware, et al., "Programmable Liquid Crystal Elastomers Prepared by Thiol-Ene Photopolymerization", ACS Macro Letters, vol. 4, Issue 9, Aug. 17, 2015, pp. 942-946.

Matthew K. McBride, et al., "Thermoreversible Folding as a Route to the Unique Shape-Memory Character in Ductile Polymer Networks", ACS Applied Materials & Interfaces, vol. 10, No. 26, Jun. 8, 2018, pp. 22739-22745 (Abstract only).

Joselle M. McCracken, et al., "Molecular Engineering of Mesogenic Constituents Within Liquid Crystalline Elastomers to Sharpen Thermotropic Actuation", Advanced Functional Materials, vol. 31, Issue 16, 2100564, Feb. 17, 2021, 5 pages (Abstract only).

\* cited by examiner

BACKGROUND

BACKGROUND

METHOD OF ADJUSTING WAFER SHAPE USING MULTI-DIRECTIONAL ACTUATION FILMS

CROSS REFERENCE TO RELATED APPLICATIONS

This present disclosure claims the benefit of U.S. Provisional Application No. 63/219,414, filed on Jul. 8, 2021, which is incorporated herein by reference in its entirety.

FIELD OF THE INVENTION

The present disclosure relates to a method of semiconductor fabrication, and particularly to wafer shape optimization.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also known as microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth. All of these processing techniques can affect stresses on and in the wafer.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably rectangular) slot illumination field. The projection system projects an image of the illuminated region of the reticle pattern onto the wafer. For accurate projection, it is important to expose a pattern of light on a wafer that is relatively flat or planar, preferably having less than 10 microns of height deviation. Thus, a method for optimizing wafer shape is desired.

SUMMARY

The present disclosure relates to a method of processing a substrate, including forming an actuator film on a first surface of a wafer, the wafer including the first surface and a second surface opposite the first surface, the actuator film including an actuator material, the actuator film being sensitive to a predetermined activating stimulus, the actuator film configured to undergo a positional change in response to activation of the actuator material; and activating the actuator material in the actuator film via the predetermined activating stimulus at locations along the first surface of the wafer and causing a stress within the actuator film, the stress modifying a shape of the wafer.

The present disclosure additionally relates to a method of processing a substrate, including receiving a wafer including a first structure on a first surface of the wafer, the wafer including a shape; generating a shape deformation stress map for the wafer and determining a stress at a location of the first structure; forming an actuator film on the first structure, the actuator film including an actuator material, the actuator film being sensitive to a predetermined activating stimulus, the actuator film configured to undergo a positional change in response to activation of the actuator material; activating the actuator material in the actuator film via the predetermined activating stimulus at the location of the first structure and causing a stress within the actuator film, the stress caused within the actuator film mitigating the stress at the location of the first structure; and removing the first structure having the activated actuator film formed thereon from the first surface of the wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1A:
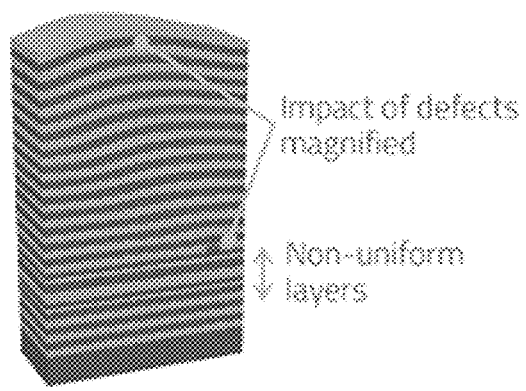
FIG. 1A is a perspective-view schematic of layers on a wafer having a defect introduced in one of the layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Figure 1B:
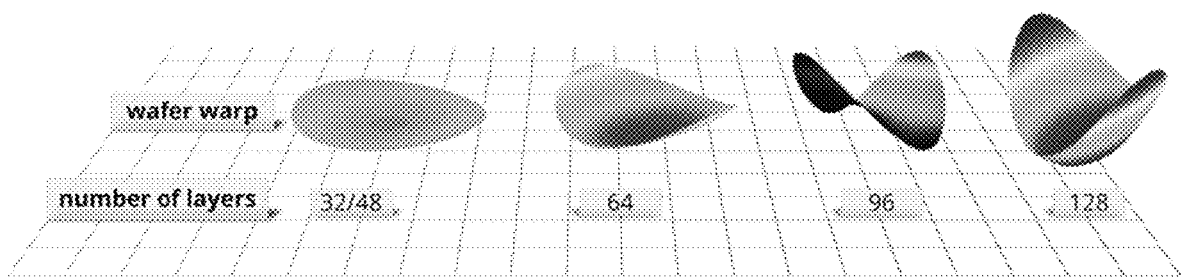
FIG. 1B is a schematic of various types and severities of resulting wafer bow.

In the fabrication of 3D NAND memory devices, the device structures can extend vertically away from a working surface of a wafer. The use of larger wafers (for example, ⅝", 100 mm, 150 mm, 200 mm, 300 mm, and 450 mm, among others) and the increasing number of layers required to fabricate state of the art integrated circuits, often results in the occurrence of significant wafer shape deformation. As 3D NAND incorporates more vertical layers, the devices also become heavier. FIG. 1A is a perspective-view schematic of layers on a wafer having a defect introduced in one of the layers. For example, 128 layers can be used for 3D NAND devices on a 300 mm wafer. As shown, a defect in an underlaying, earlier layer can be magnified to cause severe bow with later layers. FIG. 1B shows the systematic increase in the number of layers in the front side 3D NAND stack results in further wafer shape deformation and increases the severity of the problem. This can cause issues including non-uniformities, non-planarity, overlay mismatch for lithography or other processes, and wafer handling degradation. Wafer shape deformation is especially undesirable for overlay mismatch since these issues can occur early in the fabrication process and carry through subsequent steps, causing additional issues with device performance and yield.

Finding a preferably simple means for accurately optimizing wafer shape is desired. Some mitigation strategies include depositing silicon nitride (SiN) films on the backside of the wafer via, for example, chemical vapor deposition (CVD), which can cause a large amount of stress on the wafer and the devices. That is, the SiN film imposes stress on the wafer as it is deposited. This counter stress is alleviated to control bow locationally by lithographic patterning. That is, predetermined portions of the silicon nitride can be imaged, illuminated, or exposed, and subsequently removed, alleviating the stress in certain points on the wafer, hence re-shaping the wafer in a different manner. The problem introduced via the silicon nitride film method is that the method requires different tooling, which can mean a simple track-based process may be incompatible, and thus it can require loading the wafers into an entirely different tool with higher cost and lower throughput. Furthermore, the method can also be time-consuming to put the desired amount of silicon nitride on the back of the wafers. Additionally, the method is generally a very complex process to image the silicon nitride films or to tune the patterns in the silicon nitride film to alleviate the bow of the wafer. For high volume manufacturing, throughput can be a concern.

Described herein is a method for controlling and optimizing wafer shape and overlay using a high throughput process. Throughput can be increased in part because techniques herein can be embodied as modules of/within a track tool or coater-developer tool. In addition to efficiencies achieved by using a track tool, techniques herein can modify stresses on a wafer shortly following patterning. Accordingly, a separate etch process is not needed to release or create stresses from a patterned film.

The method described herein includes coating a single layer actuator film or multi-layer actuator film on the backside of a wafer. The actuator film includes one or more chemical actuators. Chemical actuators are various molecules, crystals, chemical compounds and other chemical compositions that are capable of imposing directional stress in response to application of an external stimulus on the chemical actuator. The external stimulus can include a particular wavelength of light or polarization of light, or heat (or directed infrared radiation), or even "load", which can include load-responsive actuation or pressure-responsive actuation. Thus, there are several different external stimuli that can be applied. The activating stimulus can also be applied at specific locations on the wafer film, such as according to a wafer shape correction map of the wafer. The actuation herein can be programmable or patternable in accordance with what is needed to mitigate global and/or local shape or bow from a wafer stress map from front side bow measurements. Such chemical actuators can be "shape memory" in nature in that a created stress remains post stimulus. Actuators can be reversible or multidirectional. Direct-write exposures, such as by using a laser scanned across an actuator film, can be used herein.

Embodiments herein include the steps of depositing a chemical actuator film and activating the at least one chemical actuator by location-specific stimulus application to cause a modified wafer shape, all executed on a coater-developer tool. A stand-alone tool can be used to execute techniques herein but there are significant advantages to executing techniques herein on a track tool. Track tools can be connected to scanners and steppers and can be used for several processing steps, such as coating photoresist films on a wafer, developing wafers, and cleaning wafers. Scanners and steppers or other photolithography tools benefit immensely by having a relatively planar wafer, that is, a wafer without curvature and bowing. Thus, correcting any such wafer shape deformation prior to exposure of lithographic patterns means better, more accurate patterning.

The methods described herein also include reversible adjustment of the forces applied to the wafer. Accordingly, wafer shape correction herein has adaptable capability that is not present with wafer shape correction achieved through patternable polymeric crosslinking alone. Preferably, chemical actuator films are deposited on a backside surface of wafers, but embodiments can include depositing chemical actuator materials on front side surfaces as well.

The process for backside (or front side) formation of actuator films can be different depending on the type of actuator platform being formed. In general, however, a chemical actuator film can be formed on the backside of a wafer either before or after full wafer processing, or at any stage there between. For wafer shape correction, a stress map of global and/or local bow can be used to program a stress correction pattern, which can be an inverse stress pattern to be imposed by the backside actuator film upon actuation. Techniques herein can be embodied within a stand-alone tool or embodied as one or more modules within a track (coater-developer) tool, or other semiconductor system.

A chemical actuator is a molecule or compound or other material that, in response to a stimulus, changes in physical position or orientation. In other words, a chemical actuator material can elongate, contract, bend, change crystal orientation or chemical arrangement, or other physical change that modifies an internal stress. Some chemical actuators can have a radical rearrangement. One benefit of chemical actuators is that reversing stresses or physical change is a feature of some actuators. This is beneficial compared to crosslinking because it is difficult to unlink a crosslinked film. With reversible actuators and/or incremental change availability, a single actuator film can be activated many different times to modify internal stresses. This can be very useful because as structures are patterned on and layers are added to a wafer, then the wafer surface can become more and more bowed and warped. Moreover, stresses across a wafer are often non-uniform. Actuator films here are versatile to address both local wafer distortions and global wafer (full wafer) distortions.

In an embodiment, a wafer can include a first surface and a second surface. The first surface can be a working surface and the second surface can be a backside of the wafer. An actuator film can deposited on the backside of the wafer and after a first set of fabrication steps are performed (such as shallow trench isolation, doping, initial channel formation), the wafer can be measured to identify bow. In an embodiment, a wafer stress map can be generated correlating to the degree of wafer shape deformation at locations along the wafer. For example, the wafer stress map can indicate stress values to mitigate across the coordinate locations along the first surface of the wafer. A wafer shape correction image or pattern based on the wafer stress map can be exposed to the actuator film. This exposure can cause a physical positional change in the actuator within the actuator film. This physical change in turn can modify internal stresses within the actuator film, which in turn can exert stresses on the wafer. These stresses can flatten a wafer from initial bowing or reduce bowing to within a desired threshold. With the wafer flattened, additional processing steps can be executed. With a flattened wafer, overlay is improved, especially for photolithographic patterning. As fabrication continues with additional materials deposition and removal and modification, stresses again build up in the wafer causing bowing greater than a desired amount. At this point, the wafer can be measured again for bow, have a second wafer shape correction pattern calculated, and then expose the actuator film to the second wafer shape correction pattern. The second wafer shape correction pattern can consider the first exposure to account for what additional exposure is needed. Depending on the actuator film, this can mean additional intensity or duration of activating stimulus.

In an embodiment, the actuator film can be reset. A method of resetting or reversing an actuator film can depend on the type of actuator used. For example, some actuators can reverse physical change to an initial state by application of heat or specific light wavelength. Accordingly, instead of incremental changes to the actuator film, each time the actuator film is to be activated, the actuator film can be first reset. The actuator film change can be reversed, such as by application of heat. Then the wafer can be measured to identify wafer shape deformation and to calculate the second wafer shape correction pattern to apply to the actuator film. Then the second wafer shape correction pattern can be applied to the actuator film using the corresponding stimulus. Note that wafer shape correction patterns could visibly appear like an inverse of the wafer shape deformation pattern, or could appear different, such as with optical proximity correction patterns. A given wafer shape correction pattern depends on the amount of stress needed, the directions the stress is needed, the type of actuator film or films, as well as materials or devices stacked on the wafer.

In an embodiment, more than one layer of the actuator film or the actuator film including multiple actuators can be used. Using multiple actuators and/or films enables additional functionality. For example, predetermined actuators can have different types of physical change as well as different activating stimuli. Accordingly, in an embodiment, a first actuator can be activated at a first predetermined wavelength of actinic radiation or light while a second actuator can be activated at a second predetermined wavelength of actinic radiation. As can be appreciated, either the first actuator or the second actuator can be activated separately by isolating and applying either the first predetermined wavelength of actinic radiation or the second predetermined wavelength of actinic radiation. In an example, the first actuator can undergo expansion when activated, while the second actuator can undergo contraction. With both expansion and contraction within the actuator film available, inducing either compressive stress or tensile stress is simultaneously available, which provides additional control over film stress modification. For example, the first actuator can provide compressive stress while the second actuator can provide tensile stress. For example, the first actuator can provide compressive stress while the second actuator can also provide compressive stress. For example, the first actuator can provide tensile stress while the second actuator can provide compressive stress. For example, the first actuator can provide tensile stress while the second actuator can also provide tensile stress. Bilayer films can have a difference in coefficient of thermal expansion, which can be leveraged for additional film stress control.

Actuator films herein can be deposited in various ways including typical deposition methods within the semiconductor industry. For example, deposition can be realized by spin-on deposition. A track tool module can be configured to dispense a liquid formation containing the actuator. The wafer can be spun with dispensed liquid on the wafer surface, and then any baking can be executed to set the film or remove solvents. It may be appreciated that deposition can also be realized by spray-on coating, vapor deposition, and other techniques.

Described herein are actuator materials that can be selected for use in optimizing wafer shape. Actuator materials that are preferred for wafer shape optimization include, but are not limited to, liquid crystal elastomers, shape memory polymers and electro-thermal/photo-thermal bilayer actuators, or composites of these platforms. The application of encased or shielded ionic electroactive polymers or polymer/inorganic piezoelectrics is also contemplated herein. The range of materials for use in actuator bow mitigation can be wide, as long as a selected material can be deposited on the surface of the wafer and protected. Such actuator materials can be combined with other film materials to facilitate layer formation. Moreover, some actuator materials can bend in different directions in response to different wavelengths or polarization of actinic radiation or light.

In an embodiment, liquid crystal elastomers or thiolene polymers have low glass transition temperature (Tg) and low temperatures of use and can be used for the actuator material. Composite systems and inclusion of higher Tg acrylate materials, however, offer the possibility of increased thermal stability and film integrity. Examples of liquid crystal elastomers that are photo-activated are seen in FIGS. 2A-4B. These are all relatively soft materials and may not be stable at elevated temperatures.

Figure 2A:
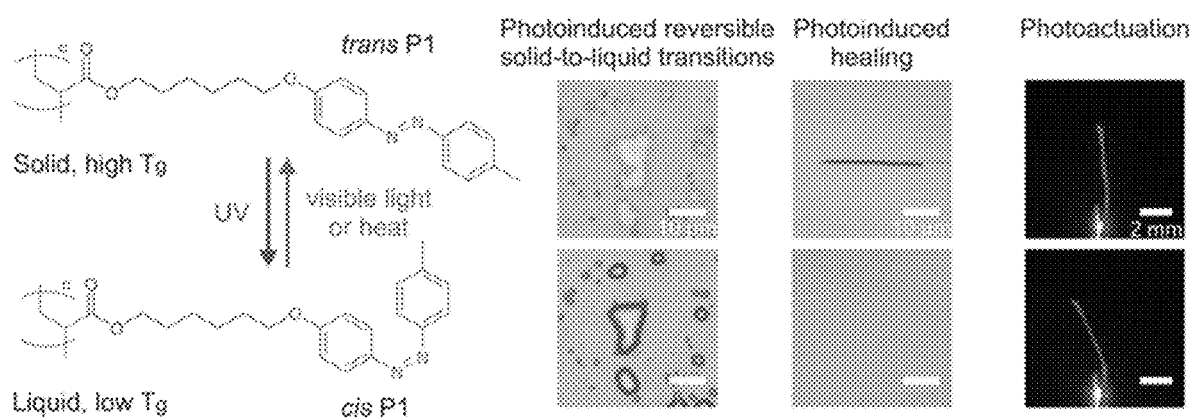
FIG. 2A is a schematic of a chemical structure and optical images of actuator film properties from said chemical, according to an embodiment of the present disclosure.

FIG. 2A is a schematic of a chemical structure and optical images of actuator film properties from said chemical, according to an embodiment of the present disclosure. In an embodiment, the actuator film includes an azopolymer P1 that can undergo photo-isomerization. The photo-isomerization can induce a solid-to-liquid transition of P1 powders (e.g., via UV light), the healing of scratches in a film formed of the azopolymer P1, and the bending of a freestanding film formed of the azopolymer P1 (see Chen, M., et al., Entangled Azobenzene-Containing Polymers with Photoinduced Reversible Solid-to-Liquid Transitions for Healable and Reprocessable Photoactuators. *Adv. Funct. Mater.* 2020, 30, 1906752. https://doi.org/10.1002/adfm.201906752).

Figure 2B:
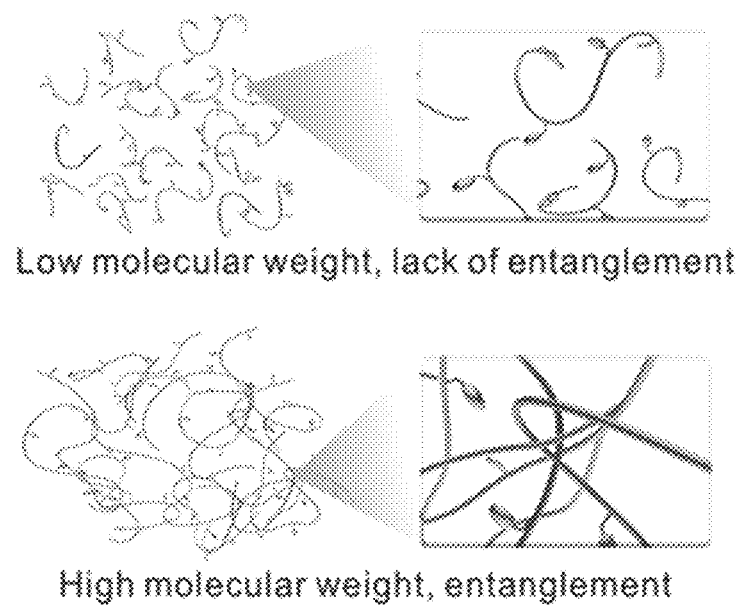
FIG. 2B is a schematic of polymer chains entangling, according to an embodiment of the present disclosure.

FIG. 2B is a schematic of polymer chains entangling, according to an embodiment of the present disclosure. In an embodiment, polymer chains of a low-molecular-weight azopolymer P1 can hardly entangle, while polymer chains of a high-molecular-weight azopolymer P1 can entangle.

Figure 2C:
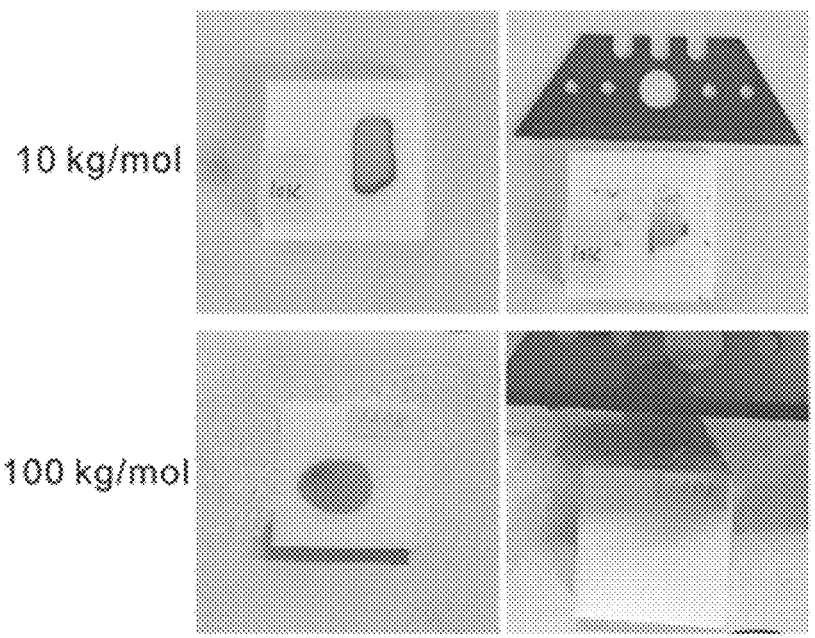
FIG. 2C is optical images of peeling of the azopolymer films from substrates, according to an embodiment of the present disclosure.

FIG. 2C is optical images of peeling of the azopolymer films from substrates, according to an embodiment of the present disclosure. In an embodiment, the film of the azopolymer P1 with a molar mass of 100 kg/mol can be easily peeled and stretched as compared to the film of the azopolymer P1 with a molar mass of 10 kg/mol. While a freestanding film of the azopolymer P1-100k can be obtained, a freestanding film of the azopolymer P1-10k may not because it can lack polymer chain entanglement and thus can be hard and brittle.

Figure 2D:
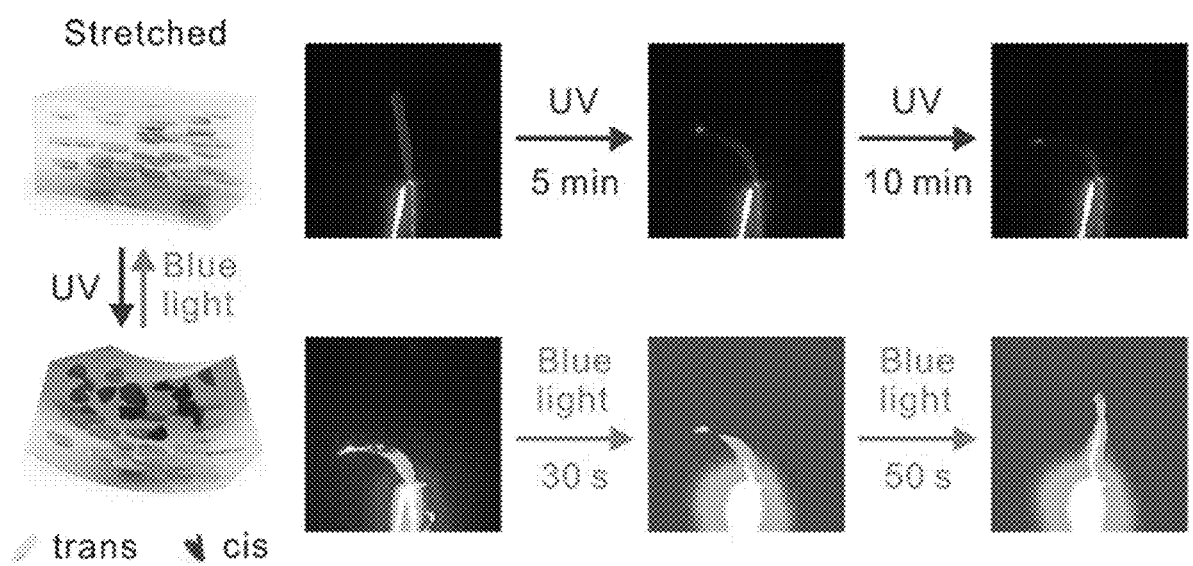
FIGS. 2D and 2E are schematics of bending of the film of the azopolymer P1-100k and accompanying optical images, according to an embodiment of the present disclosure.
Figure 2E:
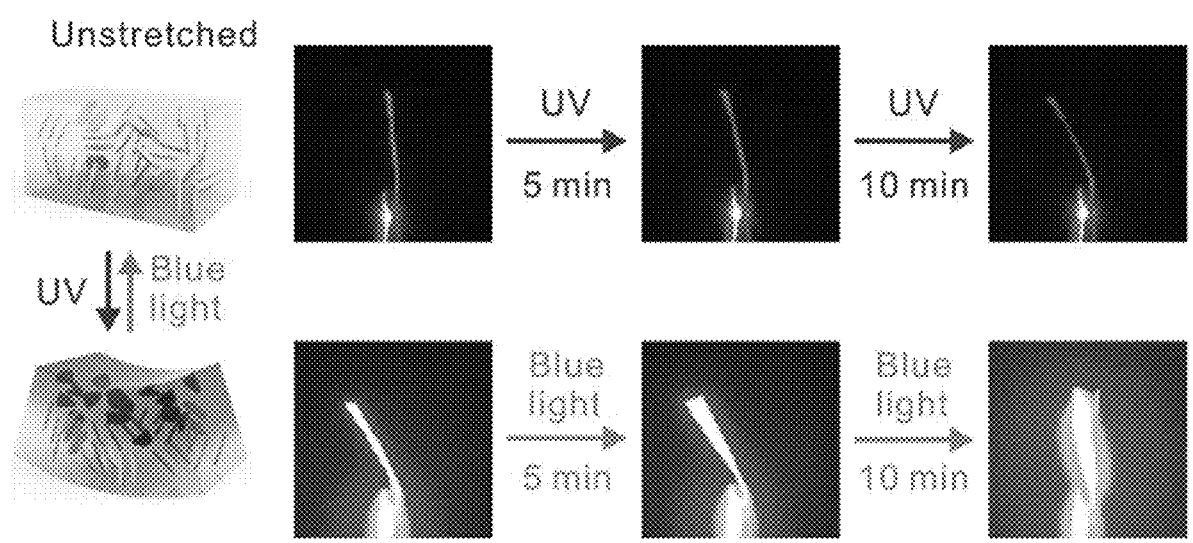

FIGS. 2D and 2E are schematics of bending of the film of the azopolymer P1-100k and accompanying optical images, according to an embodiment of the present disclosure. In an embodiment, the bending can be photo-induced and reversible. Over a first duration (e.g., 10 minutes) of exposure to actinic radiation such as UV light (e.g., 365 nm, 51 mW cm$^{-2}$) that induces a first photo-mechanical response, the film of the azopolymer P1-100k can bend or curl. Over a second duration (e.g., 50 seconds) of exposure to actinic radiation such as blue light (e.g., 470 nm, 9 mW cm$^{-2}$) that induces a second photo-mechanical response, the film of the azopolymer P1-100k can bend or curl in the opposite direction as compared to the UV exposure. Thus, the film can be reversibly photo-mechanically actuated. In FIG. 2D, the film of the azopolymer P1-100k can be stretched prior to exposure. In FIG. 2E, the film of the azopolymer P1-100k can be unstretched prior to exposure.

Figure 3A:
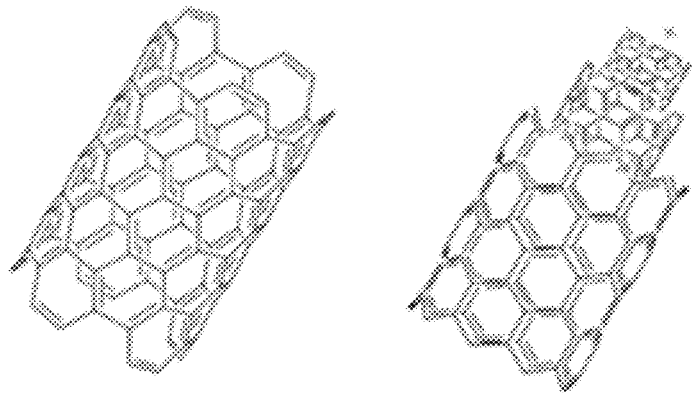
FIG. 3A is a schematic of a single walled carbon nanotube (CNT) and a multiwalled CNT, according to an embodiment of the present disclosure.
Figure 3B:
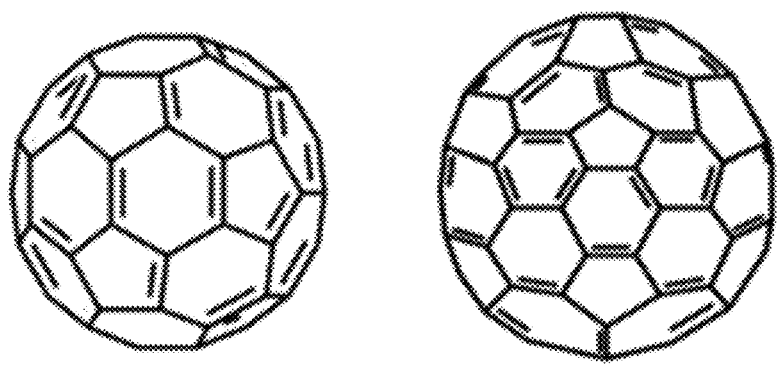
FIG. 3B is a schematic of a fullerene $C_{60}$ (left) and a fullerene $C_{70}$ (right), according to an embodiment of the present disclosure.
Figure 3C:
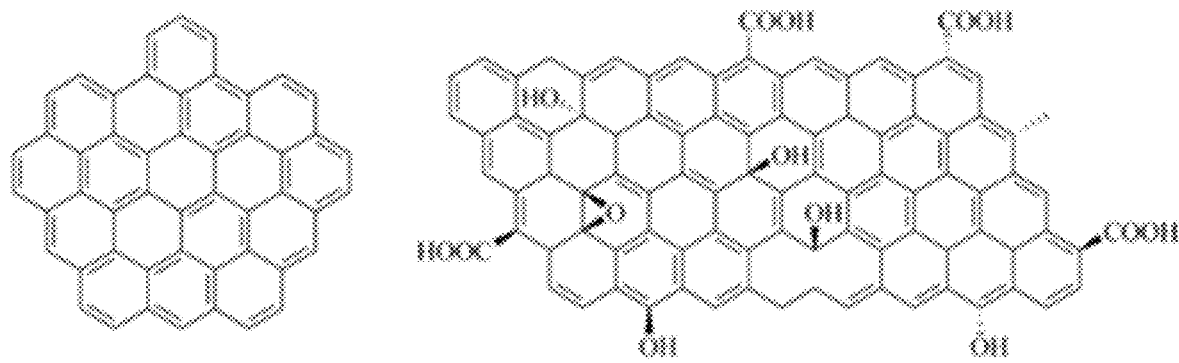
FIG. 3C is a schematic of single-layer graphene and graphene oxide, according to an embodiment of the present disclosure.

FIG. 3A is a schematic of a single walled carbon nanotube (CNT) and a multiwalled CNT, according to an embodiment of the present disclosure. FIG. 3B is a schematic of a fullerene $C_{60}$ (left) and a fullerene $C_{70}$ (right), according to an embodiment of the present disclosure. FIG. 3C is a schematic of single-layer graphene and graphene oxide, according to an embodiment of the present disclosure. In an embodiment, a class of actuators that exhibits increased thermal stability and the possibility of both thermal (infrared (IR)/near IR) and photo-thermal actuation are those that include carbon nanotubes or graphene (see FIGS. 3A-3C). Most carbon materials are photothermally active and possess wideband optical absorption that permits absorption of light of various wavelengths, and most have high photothermal conversion. These actuators can either be composites (i.e. carbon type plus other liquid crystal elastomers in the same layer) (see FIGS. 4A-4C), or photo-thermal bilayers where carbon nanotubes can be layered with other materials that have very different coefficients of thermal expansion (CTE), such as carbon nanotubes and boron nitride (see FIGS. 5A-5B). The technology for processing carbon nanotubes and graphene (graphene oxide) has advanced significantly and not only can these materials be solution processable (see FIGS. 6A-6B), but they can also be tuned to specific wavelengths of light based on the chirality of a single walled carbon nanotube (see FIG. 7).

Figure 4A:
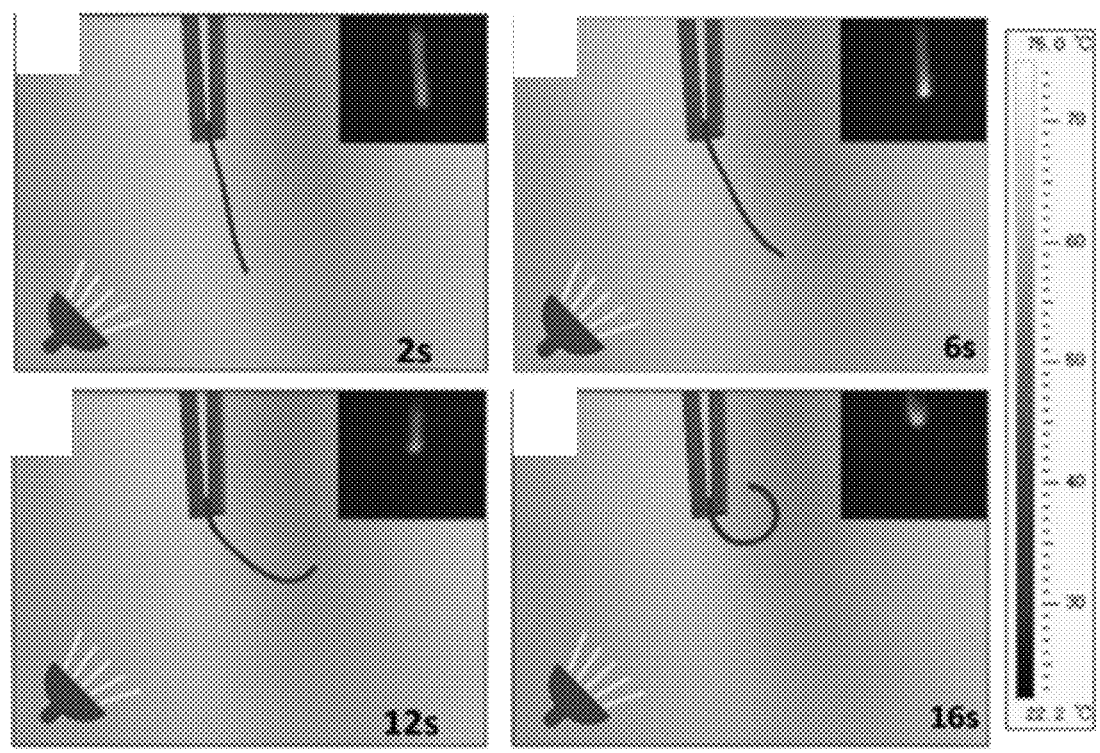
FIG. 4A is optical images of a multidirectional actuator incorporating carbon materials along with PDMS and chitosan, according to an embodiment of the present disclosure.

FIG. 4A is optical images of a multidirectional actuator incorporating carbon materials along with PDMS and chitosan, according to an embodiment of the present disclosure. In an embodiment, the optical images and infrared images (inset) demonstrate light-driven actuation of the PDMS-CNT/chitosan actuator with different irradiation times (see Xu, H., et al., (2019), An Ultra-large Deformation Bidirectional Actuator Based on a Carbon Nanotube/PDMS Composite and a Chitosan Film. J. Mater. Chem. B, 7, 7558-7565. https://doi.org/10.1039/C9TB01841G).

Figure 4B:
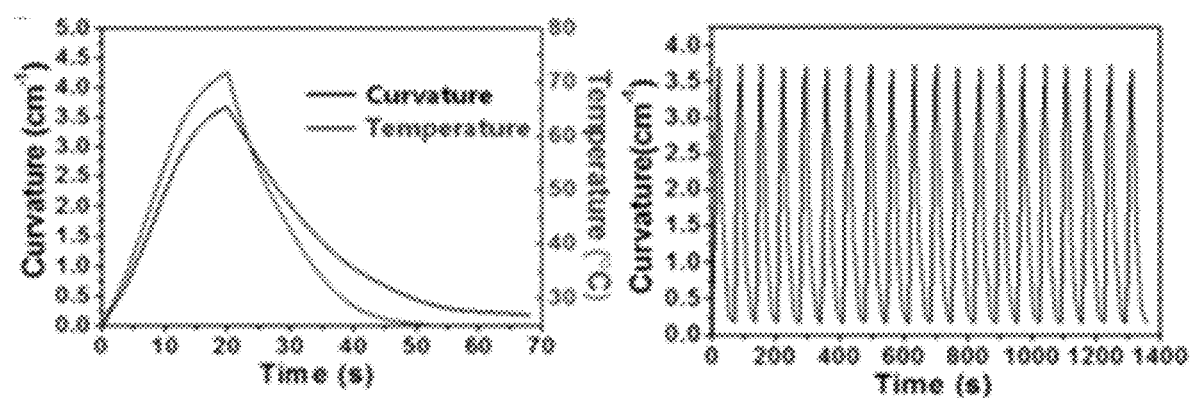
FIG. 4B is graphs of the curvature of the actuator material as a function of time, according to an embodiment of the present disclosure.

FIG. 4B is graphs of the curvature of the actuator material as a function of time, according to an embodiment of the present disclosure. In an embodiment, the graph on the left demonstrates one actuation and recovery cycle of the PDMS-CNT actuator, while the graph on the right demonstrates a repeatability test of the light-driven PDMS-CNT actuator.

Figure 4C:
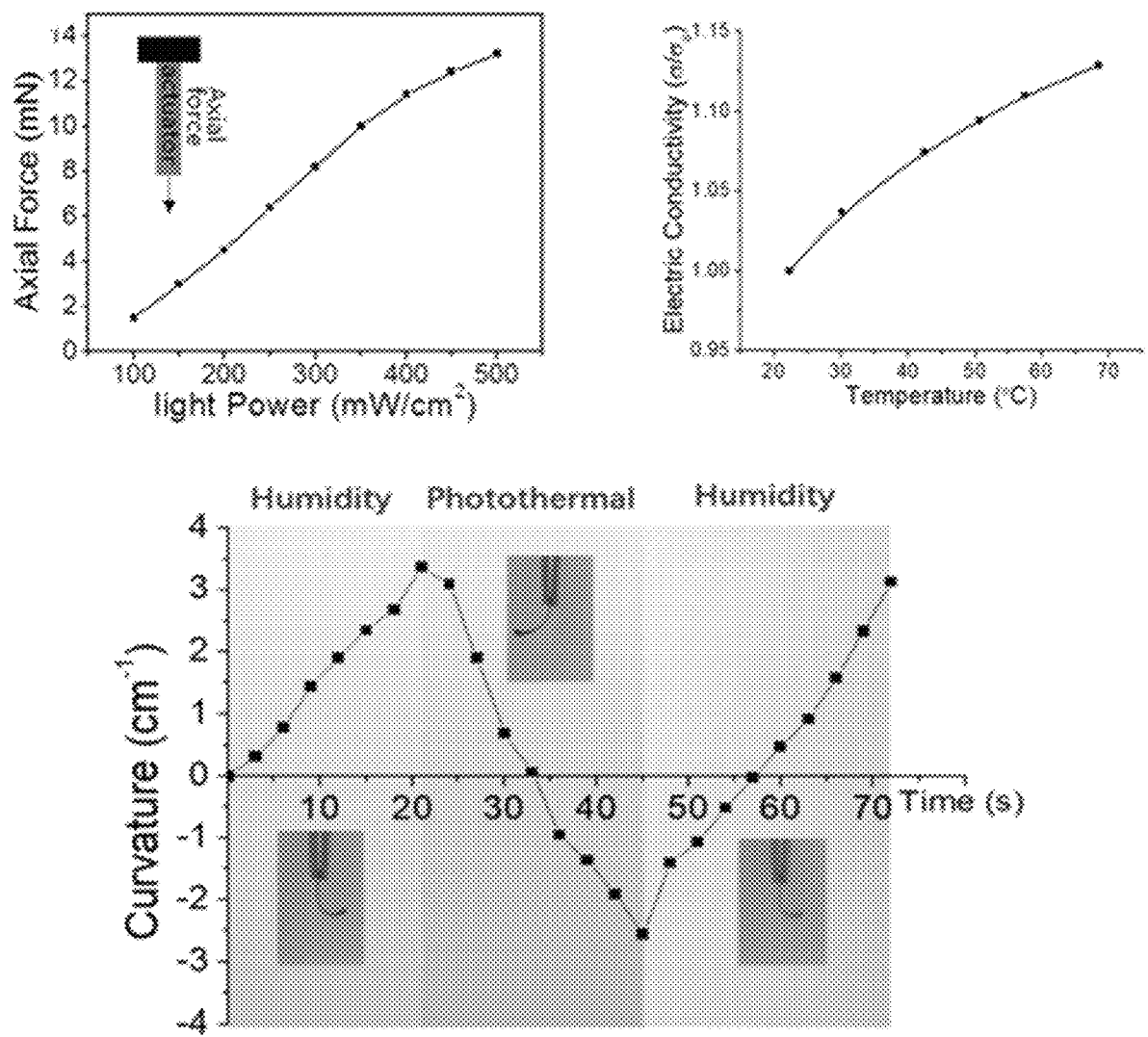
FIG. 4C is graphs of various properties of the actuator, according to an embodiment of the present disclosure.

FIG. 4C is graphs of various properties of the actuator, according to an embodiment of the present disclosure. In an embodiment, the graph in the top-left demonstrates axial force measurement of the PDMS-CNT/chitosan actuator versus different light power densities, the graph in the top-right demonstrates alteration of the electric conductivity of the PDMS-CNT/chitosan actuator (15% CNT) versus temperature, and the bottom graph demonstrates curvature of the PDMS-CNT/chitosan actuator versus time undergoing a switch of light-humidity-light driven actuations. Notably, the insets are the optical images of the PDMS-CNT/chitosan actuator at different actuation periods. The positive value indicates a bending to the PDMS-CNT side, while the negative value indicates a bending to the chitosan side.

Figure 5A:
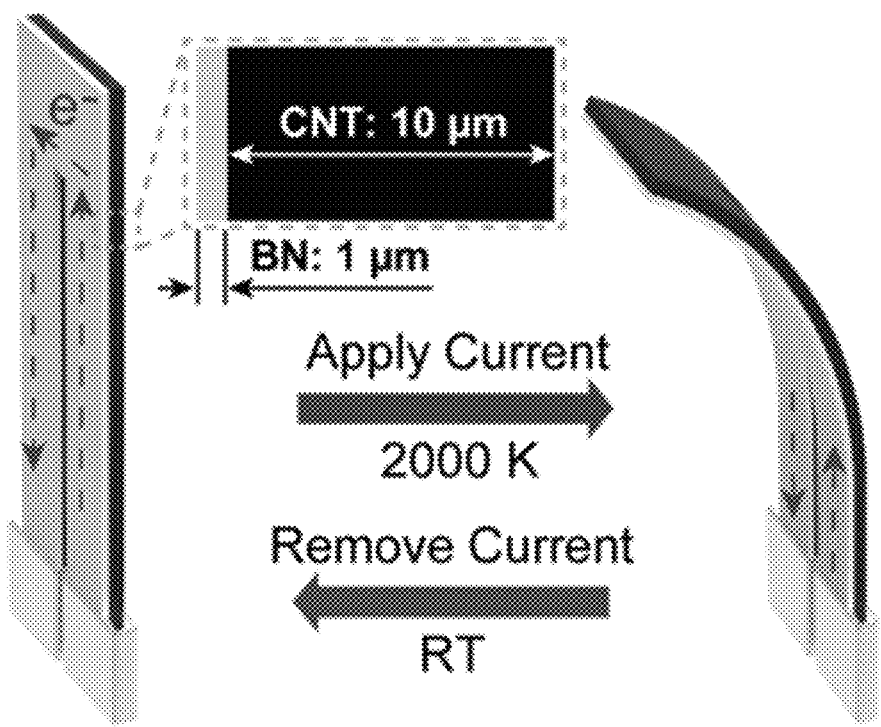
FIG. 5A is a schematic of a CNT-boron nitride (BN) bilayer actuator responsive to joule heating, according to an embodiment of the present disclosure.

FIG. 5A is a schematic of a CNT-boron nitride (BN) bilayer actuator responsive to joule heating, according to an embodiment of the present disclosure. In an embodiment, via selective Joule heating, a freestanding U-shape CNT thin film with a thickness of, for example, 10 μm can be heated up to 2000 K within 100 ms, at which the actuator bends toward the BN side (see Wang, C., et al., (2016), A Solution-Processed High-Temperature, Flexible, Thin-Film Actuator. Adv. Mater., 28: 8618-8624. https://doi.org/10.1002/adma.201602777). When the current is removed, the actuator can quickly cool to room temperature through radiation and thermal conductance. The large surface area and high thermal conductivity of the CNT thin film can allow for fast cooling.

Figure 5B:
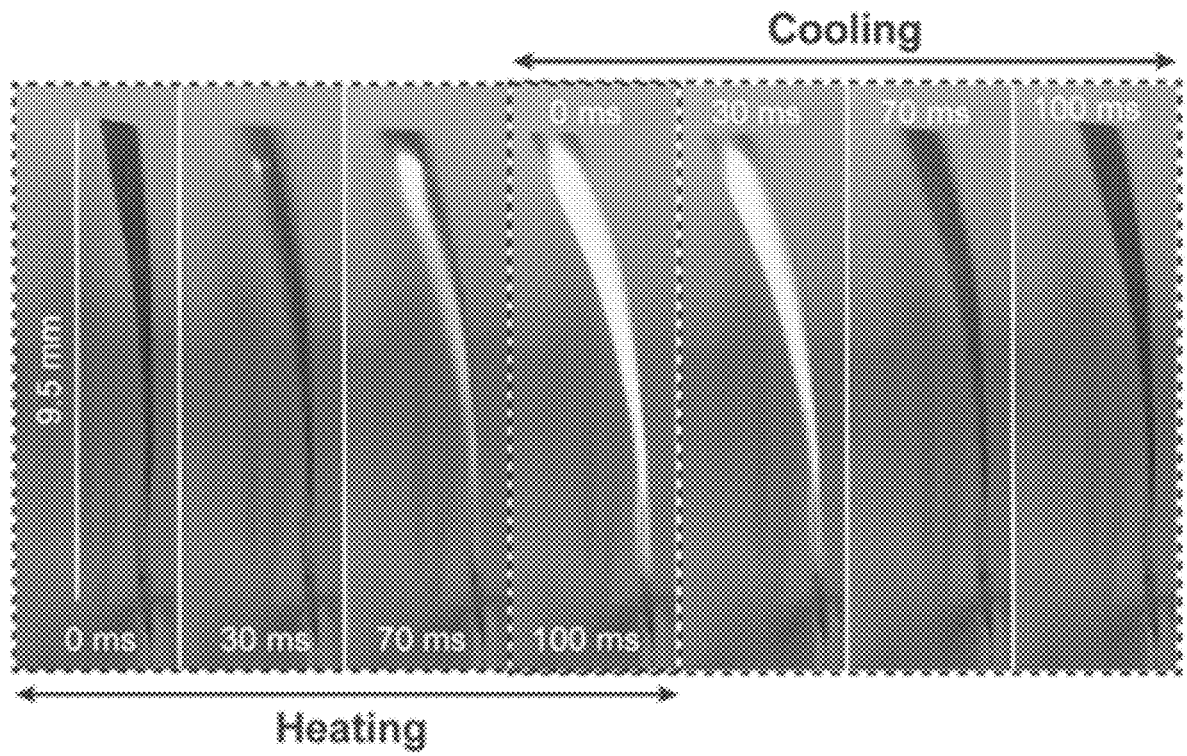
FIG. 5B is optical images of the CNT-BN bilayer actuator responsive to temperature, according to an embodiment of the present disclosure.

FIG. 5B is optical images of the CNT-BN bilayer actuator responsive to temperature, according to an embodiment of the present disclosure. In an embodiment, time-lapse images of the bilayer actuator demonstrate a response to applied heat during heating and cooling cycles and the fast response windows possible. Notably, the CNT-BN actuator can be stable to high temperatures (e.g., 1726° C.), are thin and flexible, have fast switching (e.g., 100 ms response time), and are durable in excess of 10,000 cycles.

Figure 6A:
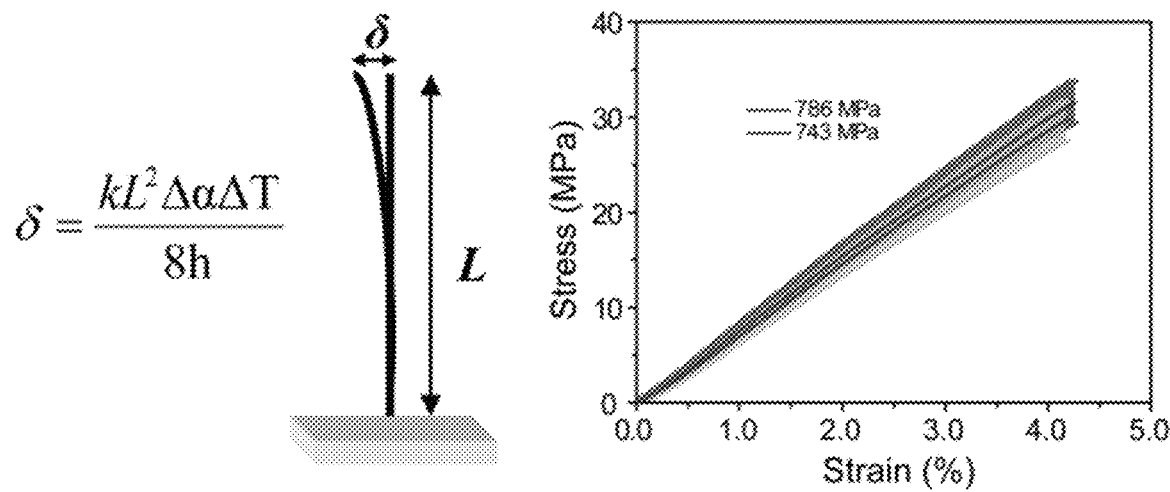
FIG. 6A is a schematic and equation for the deflection of the CNT-BN bilayer actuator, according to an embodiment of the present disclosure.

FIG. 6A is a schematic and equation for the deflection of the CNT-BN bilayer actuator, according to an embodiment of the present disclosure. In an embodiment, the CNT-BN bilayer actuator can be characterized after high-temperature actuation as demonstrated via the equation and accompanying descriptive schematic (left) and the stress-strain measurements for the CNT film and the CNT-BN bilayer film (right) (see Wang, C. et al., (2016), A Solution-Processed High-Temperature, Flexible, Thin-Film Actuator. Adv. Mater., 28: 8618-8624. https://doi.org/10.1002/adma.201602777.

Figure 6B:
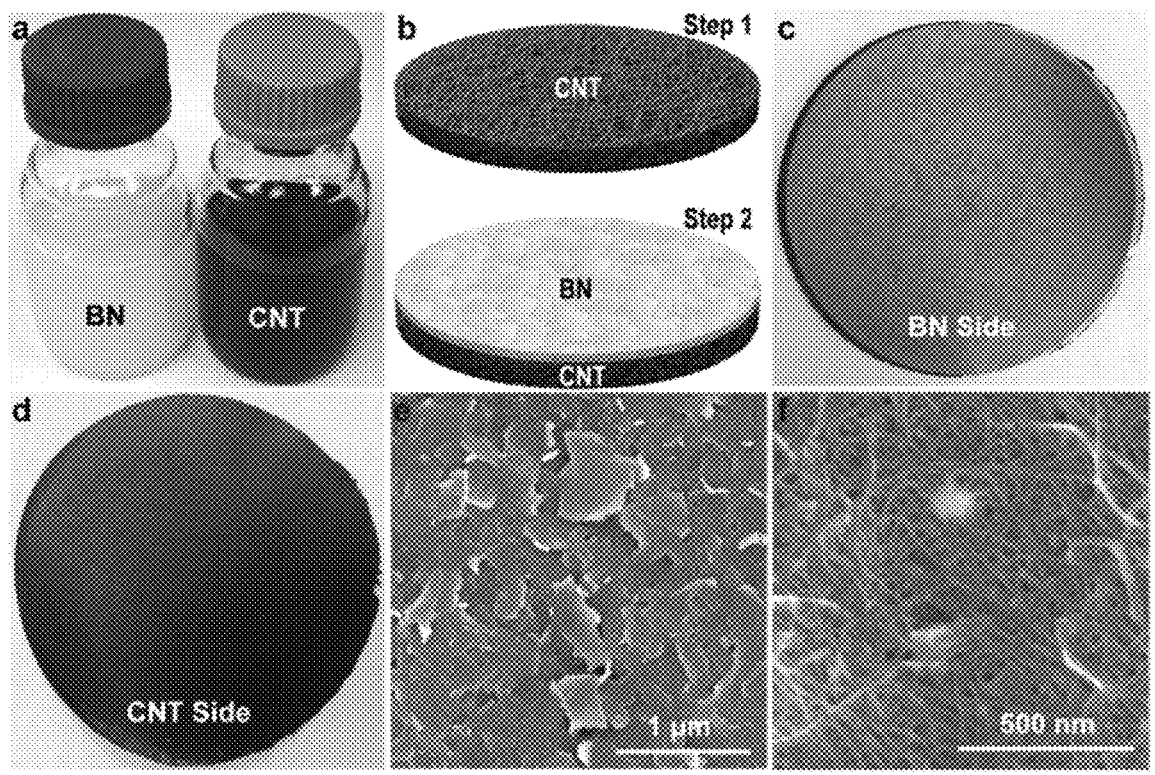
FIG. 6B is a series of schematics and images demonstrating the fabrication and characterization of the CNT-BN bilayer films, according to an embodiment of the present disclosure.

FIG. 6B is a series of schematics and images demonstrating the fabrication and characterization of the CNT-BN bilayer films, according to an embodiment of the present disclosure. In an embodiment, the fabrication can include the use of stable and uniform BN and CNT solutions. Since both CNTs and BN nanosheets can be suspended into solvents to form stable inks, the bilayer thin film can be fabricated by a two-step vacuum filtration process. Optical images and scanning electron microscopy images demonstrate film topology for the CNT-BN bilayer films.

Figure 7:
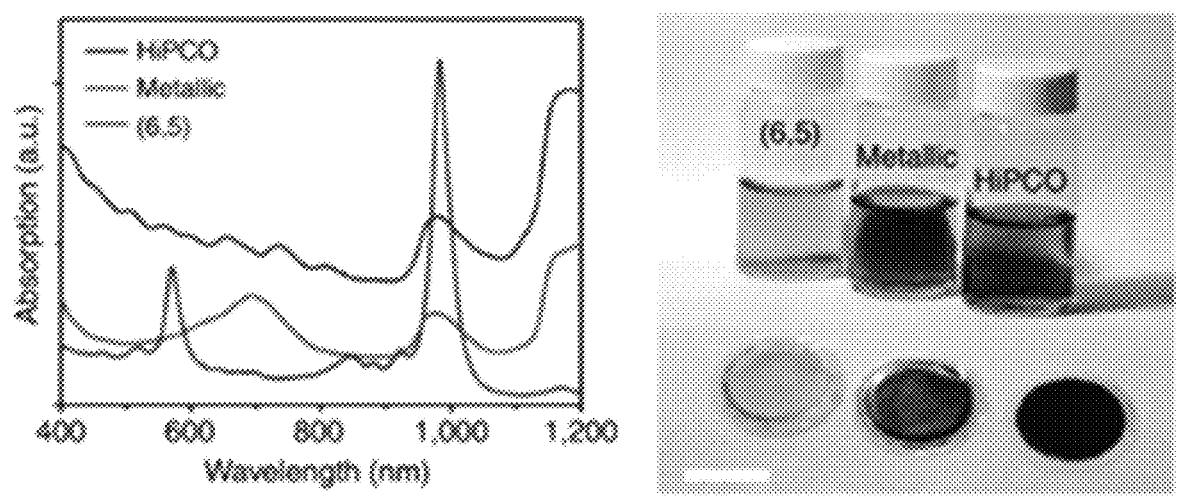
FIG. 7 is a graph of optical properties of a single walled CNT-polymer bilayer actuator and an image of various solutions of the single walled CNTs (SWCNTs), according to an embodiment of the present disclosure.

FIG. 7 is a graph of optical properties of a single walled CNT-polymer bilayer actuator and an image of various solutions of the single walled CNTs (SWCNTs), according to an embodiment of the present disclosure. In an embodiment, three types of SWCNTs can be used to tune the light absorption properties: i) high-pressure carbon monoxide disproportionation (HiPCO) SWCNTs, ii) metallic nanotubes with a single absorption peak at ≈700 nm, and iii) single-chirality nanotubes with characteristic absorption peaks at ≈560 and 970. The type-dependent SWCNTs can serve as excellent light absorbers and wavelength-sensitive media. This special optical property allowed for actuators with monochromatic light-driven features (see Wang, T., et al., (2017), Maximizing the Performance of Photothermal Actuators by Combining Smart Materials with Supplementary Advantages. Sci. Adv. 3, e1602697. DOI: 10.1126/sciadv.1602697.

Techniques herein cover multiple aspects of bow mitigation where the fabrication process can be coupled with materials selection and activation to achieve backside actuation or stress modification. Similar materials and processes can also be used in front-side bow mitigation. Techniques herein include reversible or multidirectional actuation materials to correct both global and local bow. Also, in-situ wafer shape correction can be enabled, with bow corrected or correctable as bow occurs throughout the fabrication process. For example, a backside actuator film that "travels" with the wafer through processing can be used to adjust wafer shape deformation as needed. External stimulus, corresponding to the type of actuator material, can be applied at different stages or times as desired. Thus, a same actuator film can have multiple stress corrections activated throughout the fabrication process to incrementally fix or adjust stresses as needed. For stimulus that is light activated, a direct-write tool or module within a coater-developer tool can be used to active the actuator by coordinate location. For example, a scanning laser beam that can adjust light intensity by coordinate location can be used.

Carbon nanotube bilayer actuation enables "through-wafer" bow mitigation and patterning using IR light sources that are known to activate carbon-based actuator devices. Thus, the wafer can remain with the backside down on a wafer holder, while IR light from above can be directed at or through the wafer. Notably, silicon is largely transparent to IR wavelengths. Through-wafer patterning can therefore reduce the number of times the wafer is flipped during processing.

Extending the application of the actuator materials to the front side of the wafer allows for various process options. In an embodiment, a force can be applied at the edge of each die to coarsely correct bow on a die-to-die basis. Custom reticles can incorporate regions for actuator activation on the edge of each die, which increases throughput because a scanner can both print patterns and activate wafer shape correction. In an embodiment, the actuator materials can be embedded into the device (or devices) itself. In an embodiment, an actuator film can be applied at the end of front-side processing on top of the device itself during packaging to minimize the impact on the fabricated device.

Figure 8:
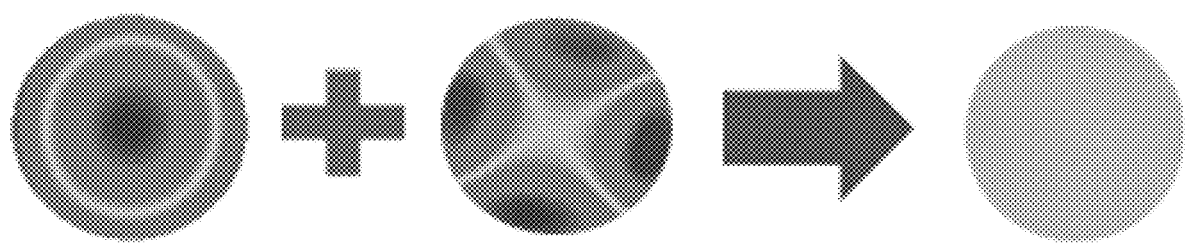
FIG. 8 is a schematic of wafer shape optimization, according to an embodiment of the present disclosure.

FIG. 8 is a schematic of wafer shape optimization, according to an embodiment of the present disclosure. In an embodiment, a wafer distortion map can be generated and then a wafer shape correction pattern can be applied, resulting in a modified or planar wafer z-height measurement.

Figure 9A:
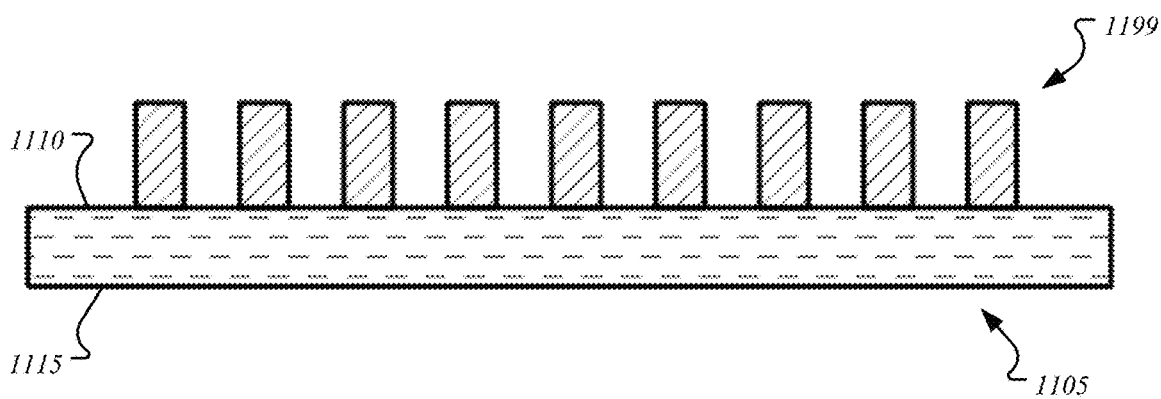
FIG. 9A is a cross-sectional substrate segment illustrating structures or devices formed on a surface, according to an embodiment of the present disclosure.

FIG. 9A is a cross-sectional substrate segment illustrating structures or devices 1199 formed on a surface, according to an embodiment of the present disclosure. In an embodiment, a wafer 305 includes a first surface 1110 and a second surface 1115. For example, the first surface 1110 of the wafer can be a working surface where the target devices are fabricated and the second surface 1115 can be a backside of the wafer. The devices 1199 formed on the working surface 1110 can be active devices or structures, or partially formed active devices or structures, such as transistors or memory cells. The wafer 1105 can be received in a coating module of a coater-developer tool or other track-based tool.

Figure 9B:
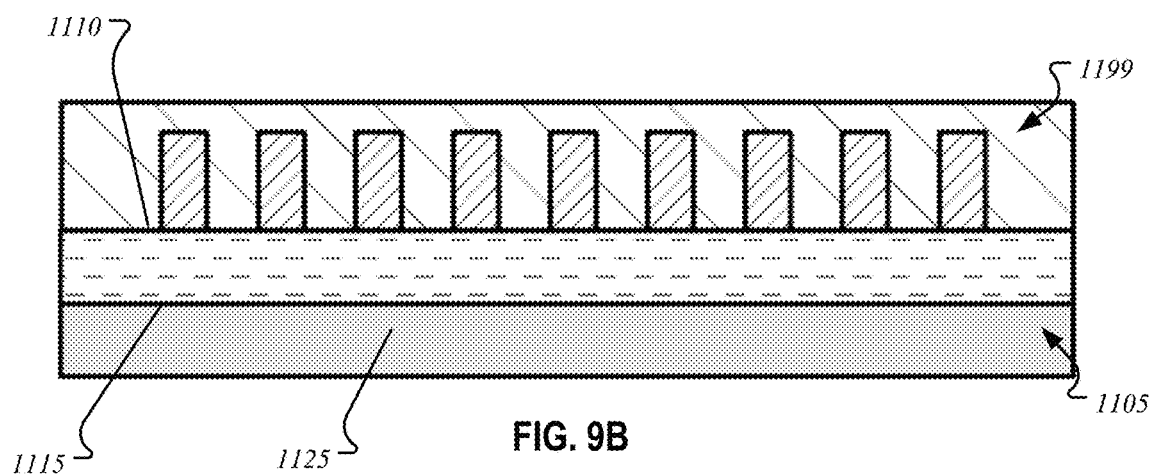
FIG. 9B is a cross-sectional substrate segment illustrating a bow modification actuator film formed on the backside of the wafer, according to an embodiment of the present disclosure.

FIG. 9B is a cross-sectional substrate segment illustrating a bow modification actuator film 1125 (herein referred to as "actuator film 1125") formed on the backside 1115 of the wafer 1105, according to an embodiment of the present disclosure. In an embodiment, the wafer 1105 can be flipped and the actuator film 1125 can be formed on the backside 1115, but the wafer 1105 need not be flipped. For example, the tool can include systems for vertically upward directed coating, spraying, or deposition. That is, the wafer 1105 can continue on the track and the tool can form the actuator film 1115 on the backside 1115 of the wafer by spray coating. In any case, the actuator film 1125 can be formed on the backside 1115, and the actuator film 1125 can include one or more actuators responsive to light, temperature, current, a chemical, or the like as previously described with reference to actuators described in FIGS. 2A-7. For the devices 1199 disposed on the working surface 1110, a protective fill or protective film can be deposited, or a carrier wafer can be attached, to facilitate handling of the wafer 1105.

Figure 9C:
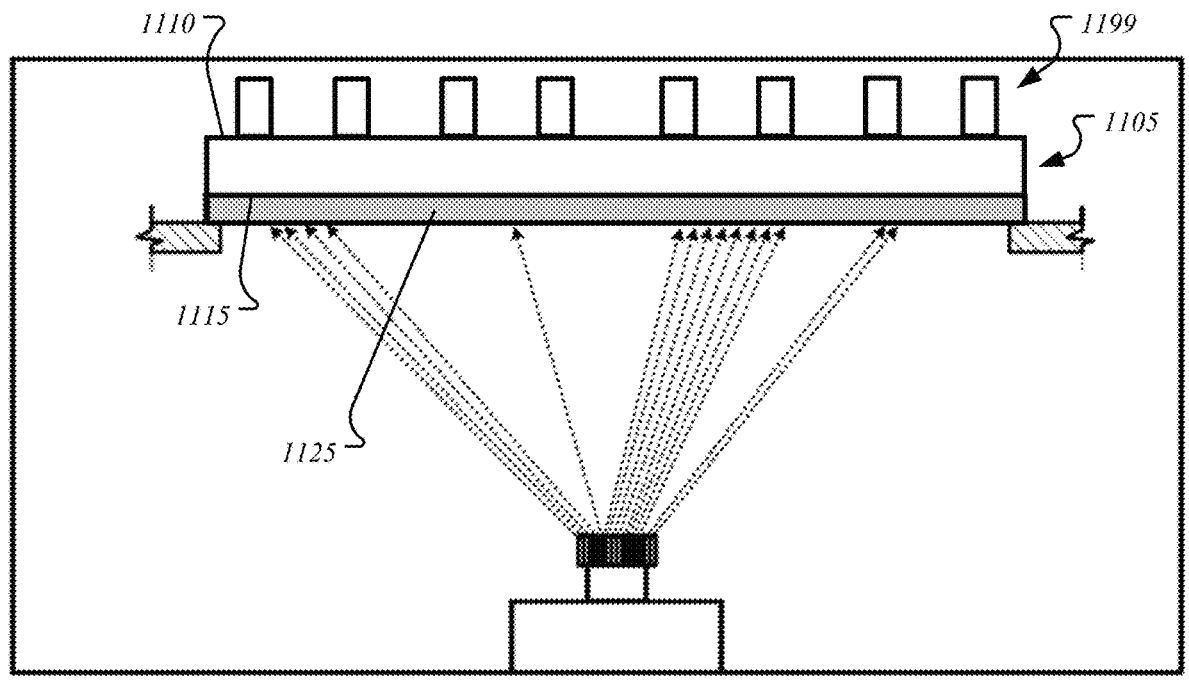
FIG. 9C is a cross-sectional segment of the wafer 1105 during direct-write laser projection, according to an embodiment of the present disclosure.

FIG. 9C is a cross-sectional segment of the wafer 1105 during direct-write laser projection, according to an embodiment of the present disclosure. In an embodiment, the actuator film 1125 can be activated by direct-write laser projection on the backside 1115 of the wafer 1105, for example, while the wafer 1105 is still on the track in the tool. A wafer shape correction pattern, based on a generated wafer shape deformation stress map of the wafer 1105, can be projected using a digital light processing chip, laser galvanometer, or otherwise. A scanning laser beam can be used. Note also that the wafer 1105 can be flipped for activation of the actuator film 1115, but need not be. Advantageously, as previously described, the backside 1115 of the wafer 1105 can be coated with the actuator film 1125 while on the track and the actuator film 1125 can also be activated without moving or flipping the wafer 1105 while on the track.

The exposure can cause a physical positional change of the actuator within the actuator film 1125. This physical change in turn can modify internal stresses within the actuator film 1125, which in turn can exert stresses on the wafer 1105. These stresses can flatten the wafer 1105 from initial bowing or reduce bowing to within a desired threshold. As the wafer 1105 progresses through processing, the wafer 1105 can be measured again for bow, have a second wafer shape correction pattern calculated, and then expose the actuator film 1125 to the second wafer shape correction pattern. The second wafer shape correction pattern can consider the first exposure to account for what additional exposure is needed. Depending on the actuator film 1125, this can mean additional intensity or duration of activating stimulus.

In an embodiment, as previously mentioned, the actuator film 1125 can be reset. For example, some actuators can reverse physical change to an initial state by application of heat or specific light wavelength. Accordingly, instead of incremental changes to the actuator film 1125, each time the actuator film 1125 is to be activated, the actuator film 1125 can be first reset. The actuator film 1125 change can be reversed, such as by application of heat. Then the wafer 1105 can be measured to identify wafer shape deformation and to calculate the second wafer shape correction pattern to apply to the actuator film 1125. Then the second wafer shape correction pattern can be applied to the actuator film 1125 using the corresponding stimulus, for example, while still on the track in the tool.

In an embodiment, as previously mentioned, more than one layer of the actuator film 1125, or the actuator film 1125 including multiple actuators, can be used. Using multiple actuators and/or films 1125 enables additional functionality. For example, predetermined actuators can have different types of physical change as well as different activating stimuli. Accordingly, in an embodiment, a first actuator in a first layer of the actuator film 1125 can be activated at a first predetermined wavelength of light while a second actuator in a second layer of the actuator film 1125 can be activated at a second predetermined wavelength of light. As can be appreciated, either the first actuator or the second actuator can be activated separately by isolating and applying either the first predetermined wavelength of light or the second predetermined wavelength of light. Furthermore, in an embodiment, each layer of the actuator film 1125 can correspond to a different wafer shape correction pattern. For example, the first wafer shape correction pattern can be used during exposure for the first layer of the actuator film 1125 while the second wafer shape correction pattern can be used during exposure for the second layer of the actuator film 1125. The multiple layers of the actuator film 1125 provides additional flexibility with mitigation stress in multiple directions via multiple methods. That is, a blanket actuator film 1125 could mitigate global bow (i.e., 1D) signature while the multi-directional actuator film 1125 can address local bow (i.e., 2D+) distortions. For example, the first layer of the first actuator material is pre-stressed along a first direction and the second layer of the second actuator material is pre-stressed along a second direction, wherein the first direction and the second direction are aligned. For example, the first layer of the first actuator material is pre-stressed along a first direction and the second layer of the second actuator material is pre-stressed along a second direction, wherein the first direction and the second direction are not align, such as the first direction and the second direction being orthogonal to one another.

Again, the multiple layers of the actuator film 1125 can be applied to the working surface 1110 instead of the backside 1115. Backside integration of films can lead to tradeoffs that can impact device yield. With design technology co-optimization where the multi-directional is planned for front-side integration, the benefits of the method may be realized without the trade-off. In an embodiment, selective application/removal of the multi-directional actuation film 1125 can be controlled such that the multi-directional actuation film 1125 only resides in the streets (areas between devices 1199) on the wafer 1105. In an embodiment, the actuator film 1125 can be formed along a periphery of the wafer. Local wafer 1105 shape of the die can then be controller by applying force on the perimeter of the wafer 1105.

In an embodiment, prior to singulation, the wafer 1105 as a whole can be dampening/filtering stress from effecting the chiplet. Once diced, the chiplet can pop/fracture upon release since the bulk wafer 1105 may not be filtering the stress. Thus, the multi-directional actuation film 1125 can be deposited on top of the chiplet prior to release to counteract the expected stress on a chip by chip basis.

In an embodiment, the actuator film 1125 can allow in-situ bow mitigation or correction that can correct bow as it happens or forms during the fabrication process. That is, a stress-responsive actuator can activate upon bow formation such that the actuator film 1125 mitigates the stress from the bow as it forms.

In an embodiment, the actuator film 1125 can be de-activated. For example, the actuator film 1125 can be de-activated via a predetermined de-activating stimulus at locations along the first surface of the wafer to remove the stress within the actuator film 1125.

In an embodiment, the first surface includes fully formed devices and is opposite the backside surface, and the actuator film is formed overtop each of the fully formed devices, each film of the actuator film 1125 being separate from one another and localized to each device of said each of the fully formed devices.

Figure 10:
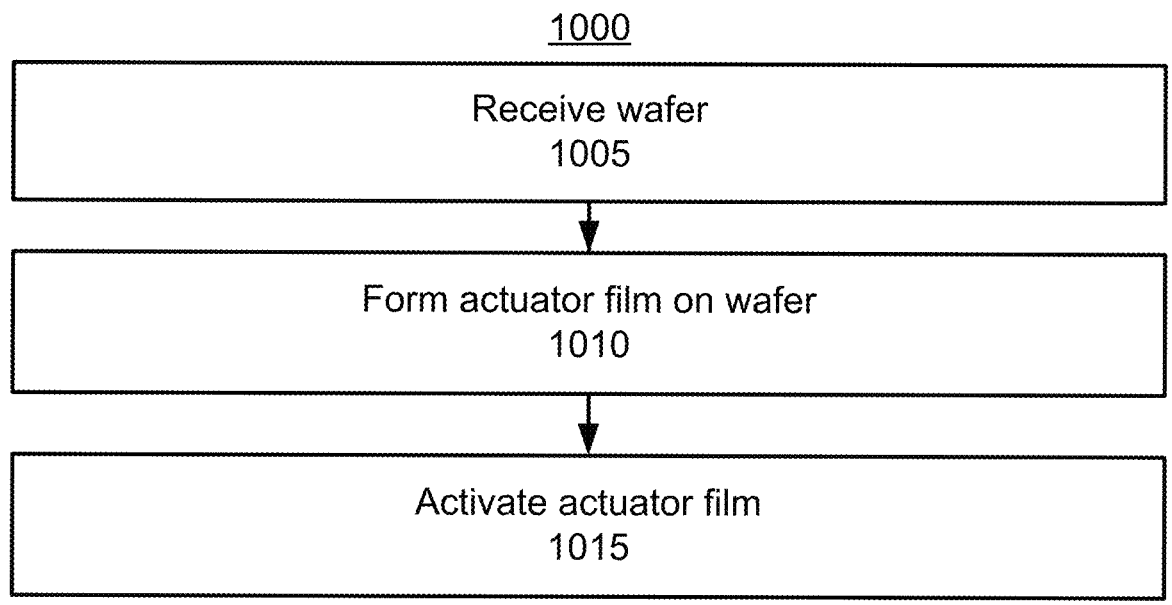
FIG. 10 is a flow chart for a method of fabricating a semiconductor device, according to an embodiment of the present disclosure.

FIG. 10 is a flow chart for a method 1000 of processing a substrate, according to an embodiment of the present disclosure.

In step 1005, the wafer 1105 can be received by the tool, the wafer 1105 can include the first surface 1110 (the working surface 1110) and the second surface 1115 (the backside 1115).

In step 1010, the actuator film 1125 can be formed on the first surface 1110 or the second surface 1115. The actuator film 1125 can include an actuator, the actuator film 1125 configured to undergo a positional change in response to activation of the actuator material.

In step 1015, the actuator material in the actuator film can be activated via the activating stimulus at locations along the first surface of the wafer and causing a stress within the actuator film, the stress modifying a bow of the wafer.

In an embodiment, structures on the wafer having the actuator film formed thereon can be removed from the surface of the wafer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a substrate, the method comprising:
    forming an actuator film on a first surface of a wafer, the wafer including the first surface and a second surface opposite the first surface, the actuator film including an actuator material, the actuator film being sensitive to a predetermined activating stimulus, the actuator film configured to undergo a positional change in response to activation of the actuator material; and
    activating the actuator material in the actuator film via the predetermined activating stimulus at locations along the first surface of the wafer and causing a stress within the actuator film, the stress modifying a shape of the wafer, the stress caused within the actuator film mitigating a determined deformation stress at a location of a first structure on the first surface.

2. The method of claim 1, wherein the first surface is a backside surface of the wafer, and the second surface includes at least partially formed structures.

3. The method of claim 1, wherein the first surface includes at least partially formed structures and is opposite a backside surface.

4. The method of claim 3, wherein the actuator film is formed in between each structure of the at least partially formed structures.

5. The method of claim 3, wherein the actuator film is formed along a periphery of an area including the at least partially formed structures.

6. The method of claim 1, wherein activating the actuator in the actuator film causes compressive stress in the actuator film.

7. The method of claim 1, wherein activating the actuator material in the actuator film causes tensile stress in the actuator film.

8. The method of claim 1, wherein the actuator film includes a first layer of a first actuator material and a second layer of a second actuator material.

9. The method of claim 8, wherein the first layer of the first actuator material is responsive to a different predetermined activating stimulus than the second layer of the second actuator material.

10. The method of claim 8, wherein the first layer of the first actuator material provides compressive stress and the second layer of the second actuator material provides tensile stress.

11. The method of claim 1, wherein the actuator film includes a first actuator material and a second actuator material, the first actuator material being responsive to a different predetermined activating stimulus than the second actuator material.

12. The method of claim 1, wherein activating the actuator material in the actuator film includes exposing the first surface to a pattern of light exposed using a direct-write system.

13. The method of claim 1, wherein forming an actuator film on the first surface of the wafer further comprises;
  depositing a first layer of a first actuator material on the first surface of the wafer, the first layer of the first actuator material being responsive to a first predetermined activating stimulus; and
  depositing a second layer of a second actuator material on the first layer of the first actuator material, the second layer of the second actuator material being responsive to a second predetermined activating stimulus, the first predetermined activating stimulus being different than the second predetermined activating stimulus.

14. The method of claim 13, wherein activating the actuator material in the actuator film further comprises:
  activating the first layer of the first actuator material using the first predetermined activating stimulus; and
  activating the second layer of the second actuator material using the second predetermined activating stimulus.

15. The method of claim 13, wherein the first layer of the first actuator material is pre-stressed along a first direction and the second layer of the second actuator material is pre-stressed along a second direction, the first direction and the second direction not being aligned.

16. The method of claim 1, further comprising:
  de-activating the actuator material in the actuator film via a predetermined de-activating stimulus at locations along the first surface of the wafer and removing the stress within the actuator film.

17. The method of claim 1, wherein
  the first surface includes fully formed devices and is opposite a backside surface,
  the actuator film comprises a plurality of portions, and
  the actuator film is formed overtop each of the fully formed devices, each portion of the plurality of portions being separate from one another and localized to each device of said each of the fully formed devices.

18. The method of claim 1, wherein activating the actuator material in the actuator film via the predetermined activating stimulus at the locations along the first surface of the wafer is based on a wafer shape deformation stress map for the wafer.

19. The method of claim 18, wherein the wafer shape deformation stress map indicates stress values to mitigate across the coordinate locations along the first surface of the wafer.

20. A method of processing a substrate, the method comprising:
  receiving a wafer including a first structure on a first surface of the wafer, the wafer including a shape;
  generating a wafer shape deformation stress map for the wafer and determining a first stress at a location of the first structure;
  forming an actuator film on the first structure, the actuator film including an actuator material, the actuator film being sensitive to a predetermined activating stimulus, the actuator film configured to undergo a positional change in response to activation of the actuator material;
  activating the actuator material in the actuator film via the predetermined activating stimulus at the location of the first structure and causing a second stress within the actuator film, the second stress caused within the actuator film mitigating the first stress at the location of the first structure; and
  removing the first structure having the activated actuator film formed thereon from the first surface of the wafer.

* * * * *